United States Patent [19]

Makinouchi

[11] Patent Number: 5,969,800
[45] Date of Patent: Oct. 19, 1999

[54] SCANNING EXPOSURE APPARATUS AND METHOD

[75] Inventor: Susumu Makinouchi, Zama, Japan

[73] Assignee: Nikon Corporation, Tokyo, Japan

[21] Appl. No.: 08/864,526

[22] Filed: May 28, 1997

[30] Foreign Application Priority Data

May 28, 1996 [JP] Japan .................................. 8-133202

[51] Int. Cl.$^6$ ................................................ G03B 27/42
[52] U.S. Cl. .......................................... 355/53; 356/400
[58] Field of Search .............................. 355/43, 45, 53, 355/68, 69, 77; 118/52; 250/548; 356/399–401

[56] References Cited

U.S. PATENT DOCUMENTS

| | | | |
|---|---|---|---|
| 5,150,152 | 9/1992 | Isohata et al. | 355/53 |
| 5,464,715 | 11/1995 | Nishi et al. | 356/400 |
| 5,477,304 | 12/1995 | Nishi | 355/53 |
| 5,650,840 | 7/1997 | Taniguchi | 355/53 |
| 5,742,067 | 4/1998 | Imai | 250/548 |
| 5,796,469 | 8/1998 | Ebinuma | 355/53 |

*Primary Examiner*—D. Rutledge
*Attorney, Agent, or Firm*—Morgan, Lewis & Bockius LLP

[57] ABSTRACT

A scanning exposure apparatus and method for synchronously moving a mask and a substrate with respect to an exposing radiation flux to project an image of a mask pattern on the mask onto the substrate, includes a movable mask stage for holding the mask, a movable substrate stage for holding the substrate, an alignment sensor detecting an initial rotational angle of the mask relative to the substrate, a projection optical system projecting the image of the mask pattern onto the substrate with a predetermined projection ratio, a mask position detector outputting first signals indicating the position of the mask stage, a substrate position detector outputting second signals indicating the position of the substrate stage, a calculation unit processing the first signals and the second signals in accordance with the projection ratio of the projection optical system and the initial rotational angle of the mask relative to the substrate to derive a positional deviation of the mask stage relative to the substrate stage, and a controller controlling the mask stage movement and the substrate stage movement to eliminate the positional deviation.

46 Claims, 5 Drawing Sheets

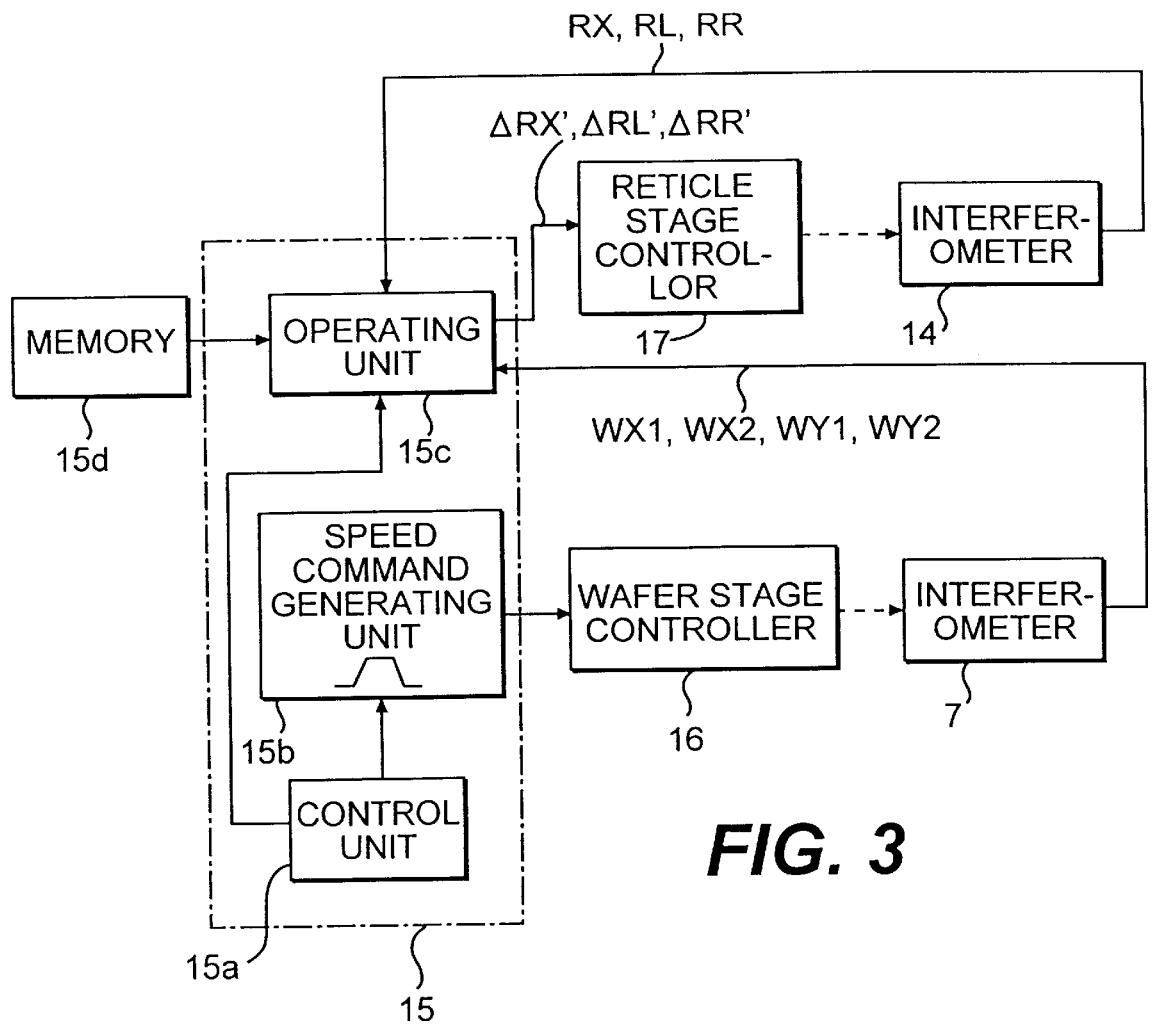
FIG. 3
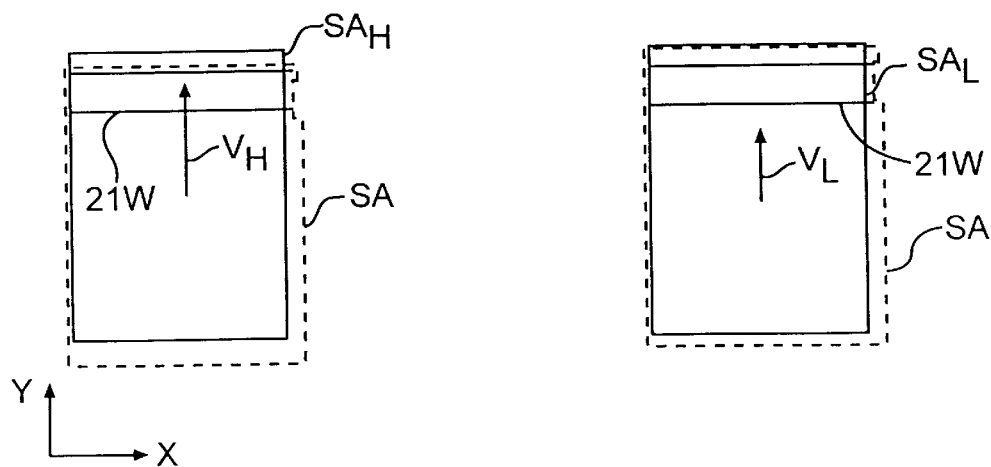
FIG. 4A  FIG. 4B

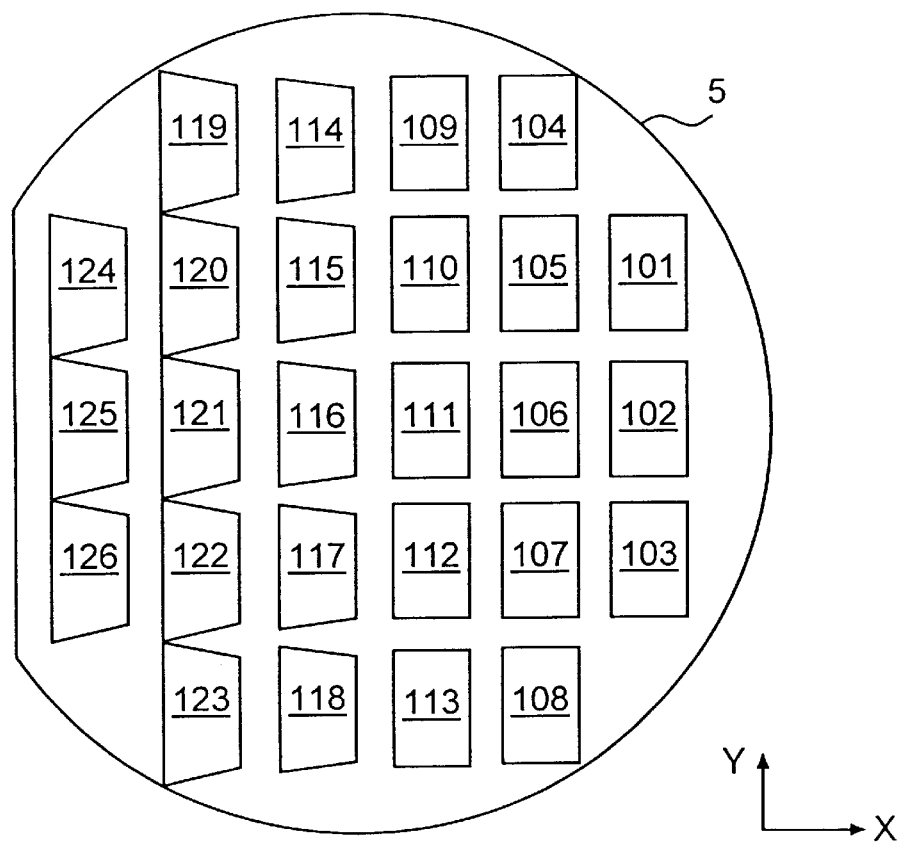
FIG. 6
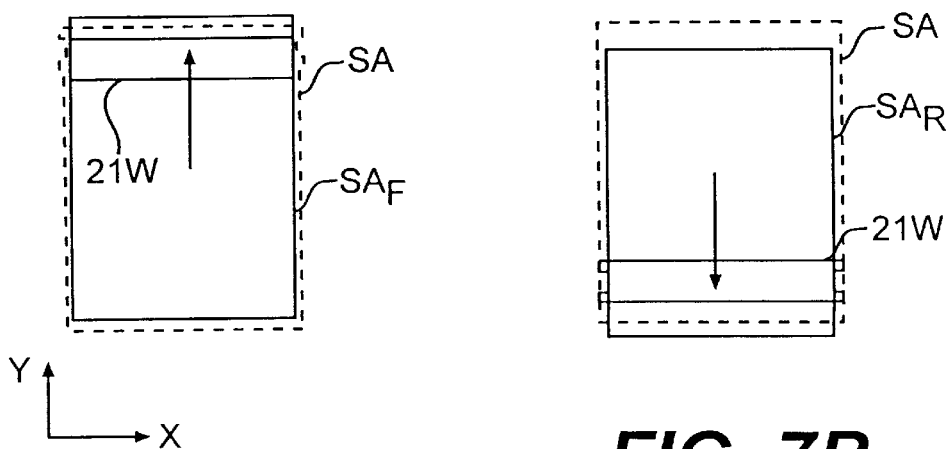
FIG. 7A  FIG. 7B

SCANNING EXPOSURE APPARATUS AND METHOD

This application claims the benefit of Japanese Application No. 08-133202, filed on May 28, 1996, which is hereby incorporated by reference.

BACKGROUND OF THE INVENTION

1. Field of the Invention

The present invention relates to a projection type exposure apparatus which is used to transfer a mask pattern onto a photosensitive substrate in a photolithographic process used to manufacture semiconductor devices, imaging devices (CCD's, etc.), liquid crystal display devices, and thin-film magnetic heads, etc. More particularly, the present invention relates to the a scanning exposure apparatus such as a projection type exposure apparatus using a step-and-scan exposure scheme in which a mask pattern is successively transferred onto respective shot areas on a photosensitive substrate by the synchronized scanning of the mask and the photosensitive substrate.

2. Discussion of the Related Art

Conventionally, in manufacture of semiconductor devices, etc., a reduction projection type exposure apparatus (steppers) using a step-and-repeat exposure scheme (one-time exposure system) has been widely used as a projection type exposure apparatus to transfer a reticle pattern (mask pattern) on a mask onto respective shot areas of a wafer coated with a photoresist. Recently, a projection type exposure apparatus using a so-called "step-and-scan" exposure scheme has attract considerable attention. In the step-and-scan exposure apparatus (or scanning exposure apparatus), reduced images of a pattern on a reticle are successively transferred onto respective shot areas of a wafer and are exposed by scanning the reticle and wafer in synchronization with each other with respect to a projection optical system. The step-and-scan exposure apparatus projects a portion of the pattern on the reticle onto the wafer via the projection optical system to meet the recent requirement that larger pattern images be transferred to the wafer without using a large or complicated projection optical system. In conventional aligners, in which the pattern on the entire surface of the reticle is transferred onto the entire surface of the wafer as a positive, unit-magnified image through a one-time scanning exposure using an integral type stage system, the structure of the apparatus is rather simple. In the step-and-scan exposure apparatus, however, it is necessary for the reticle stage and the wafer stage to move at different speeds in accordance with the projection magnification. Furthermore, since movement between the shot areas on the wafer surface is performed by stepping motion, the stage system (reticle stage and the wafer stage) becomes very complicated, and also extremely high accuracy is required in controlling the stage system and the exposure apparatus itself.

Specifically, in the case of a projection type exposure apparatus using a step-and-scan scheme, it is necessary that the reticle stage and the wafer stage be scanned independently and in a stable manner with both stages synchronized in a predetermined positional relationship. Conventionally, therefore, the following method has been used, for example. Prior to the initiation of scanning, the reticle stage and the wafer stage are aligned. Then, in synchronization with the movement (scanning) of the wafer stage at a predetermined speed in a predetermined direction, the reticle stage is moved (scanned) at a scanning speed corresponding to the predetermined speed. At the same time, the positional deviations of both stages in the scanning direction and non-scanning direction (i. e., the direction perpendicular to the scanning direction) are determined by calculation, and the position of the reticle stage, for example, is finely adjusted to reduce the positional deviations thus determined.

In the method described above, positional deviations of the reticle stage and wafer stage in the scanning direction and non-scanning direction are determined at the time of scanning exposure, and the exposure apparatus is controlled so that these positional deviations are independently corrected. Accordingly, the correction of positional deviations is performed independently in the scanning direction and the non-scanning direction even in the case where the wafer stage is rotated during scanning exposure by yawing, for example. As a result, a positional deviation (synchronization error) is generated between the reticle and the wafer.

In regard to this problem, it is possible to detect the relative rotational angle between the reticle stage and the wafer stage; and control the system such that this rotational angle is maintained at a predetermined target value. However, in the case that positional deviations in the translational direction and the rotational angle are corrected independently, since positional deviations in the translational direction are also generated by rotation, a long correction time (adjustment time) is required in order to bring such synchronization errors within a permissible range.

When superimposing exposure is performed for respective shot areas on the wafer in a one-time exposure system, the superimposition error can be reduced by correcting the wafer position in accordance with the shot arrangement of the wafer, etc., for example. In the case of a scanning exposure system, however, the reticle and wafer are scanned in synchronization with each other. Accordingly, if the wafer is warped or deformed, there is a possibility that the above-mentioned synchronization error will increase if the position of the reticle or wafer is simply subjected to a fine adjustment to correct the superimposition error.

SUMMARY OF THE INVENTION

Accordingly, the present invention is directed to a scanning exposure apparatus and method that substantially obviate the problems due to limitations and disadvantages of the related art.

An object of the present invention is to provide a scan type exposure apparatus which can align a reticle and a wafer with high accuracy at a high speed even when the reticle stage or the wafer stage is rotated during scanning exposure.

Another object of the present invention is to provide a scan type exposure apparatus which can reduce the superimposition error even if a wafer is warped or deformed.

Another object of the present invention is to provide a method of aligning a mask with a photosensitive substrate with high accuracy at a high speed.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a scanning exposure apparatus for synchronously moving a mask and a substrate with respect to an exposing radiation flux to project an image of a mask pattern on the mask onto the substrate, the scanning exposure apparatus including a movable mask stage for holding the mask; a movable substrate stage for holding the substrate; an alignment sensor detecting an initial rotational angle of the mask relative to the substrate; a projection optical system projecting the image of the mask pattern onto the substrate with a predetermined projection ratio; a mask position detector outputting first signals indicating the position of the mask stage; a substrate position detector outputting second signals indicating the position of the substrate stage; a calculation unit processing the first signals and the second signals in accordance with the projection ratio of the projection optical system and the initial rotational angle of the mask relative to the substrate to derive a positional deviation of the mask stage relative to the substrate stage; and a controller controlling the mask stage movement and the substrate stage movement to eliminate the positional deviation.

In another aspect, the present invention provides a scanning exposure apparatus for projecting a mask pattern on a mask onto a substrate, the scanning exposure apparatus including a movable mask stage for holding the mask; a movable substrate stage for holding the substrate, the substrate stage moving in synchronization with the mask stage movement; an illumination system directing an exposing radiation flux toward the mask to illuminate a portion of the mask pattern; a projection optical system receiving the exposing radiation that has passed through the mask to project the image of the mask pattern onto the substrate with a predetermined projection ratio; a mask position detector outputting first signals indicating the position of the mask stage in a first two-dimensional plane as a first vector quantity; a substrate position detector outputting second signals indicating the position of the substrate stage in a second two-dimensional plane as a second vector quantity; a calculation unit applying a transfer matrix in accordance with the projection ratio of the projection optical system and the rotational angle of the mask relative to the substrate, the calculation unit processing the first signals and the second signals to subtract one of the first and second vector signals from a vector obtained by multiplying the transfer matrix by the other one of the first and second vector signals to derive an error vector, the calculation unit further processing data indicating patterning errors in the existing pattern on the substrate to derive a calibration vector; and a controller controlling the position of the mask stage relative to the substrate stage in accordance with the error vector and the calibration vector.

In another aspect, the present invention provides a method of aligning a mask with a substrate during scanning exposure operation of an scanning exposure apparatus, the method including the steps of moving in a first predetermined direction a mask stage holding the mask; moving in a second predetermined direction in synchronization with the mask stage movement a substrate stage holding the substrate; during the step of moving the substrate stage, directing an exposing radiation flux toward the mask to illuminate a portion of a mask pattern on the mask, the exposing radiation flux thereafter entering a projection optical system to project the mask pattern onto the substrate with a predetermined projection ratio; outputting first signals indicating the position of the mask stage during the step of moving the substrate stage; outputting second signals indicating the position of the substrate stage during the step of moving the substrate stage; processing the first signals and the second signals in accordance with the projection ratio of the projection optical system to derive a positional deviation between the mask stage and the substrate stage during the step of moving the substrate stage; and during the step of moving the substrate stage, controlling the mask stage movement and the substrate stage movement to eliminate the positional deviation derived in the step of processing.

In another aspect, the present invention provides a scanning exposure apparatus for projecting a mask pattern on a mask onto a substrate, including a movable mask stage for holding the mask; a movable substrate stage for holding the substrate, the substrate stage moving in synchronization with the mask stage movement; an illumination system directing an exposing radiation that has passed through the mask to project the image of the mask pattern onto the substrate; a mask position detector outputting first signals indicating the position of the mask stage in a first two-dimensional plane; a substrate position detector outputting second signals indicating the position of the substrate stage in a second two-dimensional plane; and a calculation unit applying a transfer matrix in accordance with the rotational angle of the mask relative to the substrate, the first signals and the second signals to derive an error vector.

In a further aspect, the present invention provides a scanning exposure method for exposing an image of a mask pattern on the substrate during synchronously moving a mask and a substrate, the method including the steps of applying a transfer matrix in accordance with the rotational angle of the mask relative to the substrate, the position of the mask in a first two-dimensional plane, and the position of the substrate in a second two-dimensional plane to derive an error vector; and controlling the mask movement and the substrate based on said error vector.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a layout diagram including a block diagram which illustrates the stage control systems according to the preferred embodiment of the present invention;

FIGS. 4A and 4B show plan views illustrating positional deviations of the transferred pattern image, which depend on the scanning speed of the wafer;

FIG. 6 is a plan view of a wafer showing the distribution of the distortions in the existing pattern images over a plurality of shot areas; and FIGS. 7A and 7B show plan views of a shot area illustrating positional deviations of the transferred pattern image, which depend on scanning direction.

DETAILED DESCRIPTION OF THE PREFERRED EMBODIMENTS

Figure 1:
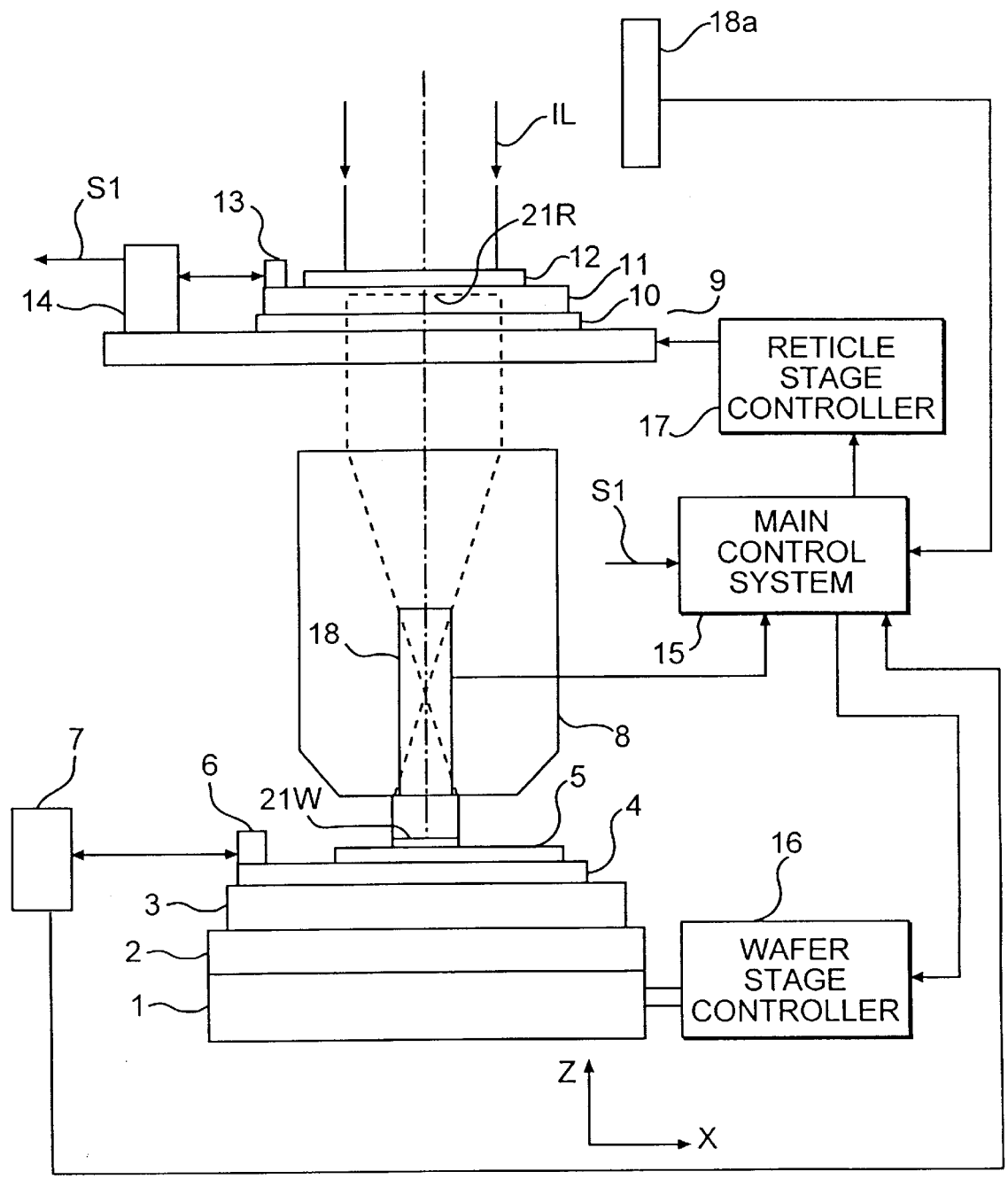
FIG. 1 is a front view showing the stage mechanism according to a preferred embodiment of the present invention.

In the present invention, the position of a mask stage (reticle stage) is expressed by a two-dimensional position (RX, RY) and a rotational angle RO, for example, and the position of a substrate stage is expressed by a two-dimensional position (WX, WY) and a rotational angle Wθ, for example. A vector quantity that contains a target position (RX*, RY*) and a target rotational angle Rθ* of the mask stage as the components is obtained by multiplying a vector (WX, WY, Wθ) by a transfer matrix A whose components include the magnification between a mask 12 and a substrate 5, and a rotational angle between the mask 12 and the substrate 5, and by adding a predetermined offset vector B, as shown below.

$$\begin{bmatrix} RX^* \\ RY^* \\ R\theta^* \end{bmatrix} = A \begin{bmatrix} WX \\ WY \\ W\theta \end{bmatrix} + B \quad (1)$$

Here, the matrix A and offset vector B can generally be expressed as follows:

$$A = \begin{bmatrix} a_{11} & a_{12} & a_{13} \\ a_{21} & a_{22} & a_{23} \\ a_{31} & a_{32} & a_{33} \end{bmatrix}, B = \begin{bmatrix} b_1 \\ b_2 \\ b_3 \end{bmatrix} \quad (2)$$

Furthermore, by introducing a matrix A' of 4 rows×4 columns as shown below, it is possible to simplify Eq. 1 to the multiplication of the following vector quantity and matrix;

$$\begin{bmatrix} RX^* \\ RY^* \\ R\theta^* \\ 1 \end{bmatrix} = A' \begin{bmatrix} WX \\ WY \\ W\theta \\ 1 \end{bmatrix}, A' = \begin{bmatrix} a_{11} & a_{12} & a_{13} & b_1 \\ a_{21} & a_{22} & a_{23} & b_2 \\ a_{31} & a_{32} & a_{33} & b_3 \\ 0 & 0 & 0 & 1 \end{bmatrix} \quad (3)$$

Then, for example, an error vector (ΔRX, ΔRY, ΔRθ) including synchronization errors is obtained by subtracting the vector (RX, RY, Rθ) representing actually measured position of the mask stage from the vector (RX*, RY*, Rθ*) indicating the target position of the mask stage determined by Eq. 3.

Furthermore, errors in the transfer position of the mask pattern (e. g., deviation of the superimposed image from the existing circuit pattern on the substrate), which are caused by deformation of the substrate in the semiconductor manufacturing process, etc., or by delay in the response speed of the stages in the scan type exposure apparatus, etc., are determined by calculation beforehand as a correction vector quantity, and the position and rotational angle of the mask stage are controlled on the basis of a vector quantity which combines the abovementioned error vector quantity (synchronization error) and this correction vector quantity. As a result, even in cases where one of the stages rotates, the mask and substrate can be aligned with a high degree of precision at a high tracking speed. At the same time, the superimposition error is also reduced.

In this case, for example, the correction vector contains at least one component selected from a set consisting of a component which is proportional to the scanning speed of one of the aforementioned two stages, a component which varies according to the position of the above-mentioned mask stage, a component which varies according to the position of the aforementioned substrate stage, and an offset component which varies according to the scanning direction of one of the two stages. Errors caused by the response speed of the stage system are corrected by the component proportional to the stage scanning speed, errors caused by errors in the drawing of the mask pattern, etc., are corrected by the component which varies according to the position of the mask stage, errors caused by warping of the substrate, etc., are corrected by the component which varies according to the position of the substrate stage, and mechanical errors in the stage system, etc., which depend on the scanning direction are corrected by the offset component which varies according to the aforementioned stage scanning direction.

Reference will now be made in detail to the preferred embodiment of the present invention, examples of which are illustrated in the accompanying drawings.

FIG. 1 shows the projection type exposure apparatus of the present example. In FIG. 1, a pattern on the pattern formation surface of a reticle 12 is illuminated by a rectangular illumination region (referred to as a "slit-like illumination region") 21R which is formed by exposing illuminating light (i. e., exposing light) IL from an illuminating optical system not shown in the figures. The image of the pattern in this illumination region 21R is reduced by a projection magnification (projection ratio) of $\beta(\beta=\frac{1}{4}, \frac{1}{5},$ etc., for example) via a projection optical system 8, and is projected onto a slit-like exposure region 21W on a wafer 5 to perform exposure. Here, the Z axis is oriented in the direction parallel to the optical axis of the projection optical system 8, the X axis is oriented parallel to the plane of the page of FIG. 1 in a plane perpendicular to the Z axis, and the Y axis is oriented perpendicular to the plane of the page of FIG. 1. When exposure is performed by the scanning exposure system, the wafer 5 is scanned at a speed of $\beta \cdot V_R$ in the +Y direction (or −Y direction) in synchronization with the scanning of the reticle 12 at a speed of $V_R$ in the −Y direction (or +Y direction) with respect to the illumination region 21R.

The driving system of the reticle 12 and wafer 5 may be described as follows. A reticle Y-axis driving stage 10 which can be freely driven in the direction of the Y-axis is mounted on a reticle supporting stand 9, and a reticle micro-driving stage 11 is mounted on the reticle Y-axis driving stage 10. Furthermore, a reticle 12 is held on the surface of the reticle micro-driving stage 11 by vacuum suction. The reticle micro-driving stage 11 controls the position of the reticle 12 in minute increments and with high accuracy in the X direction, Y direction and rotational direction (θdirection) around the Z-axis (within the plane perpendicular to the optical axis of the projection optical system 8). A moving mirror 13 is disposed on the reticle micro-driving stage 11, and the position of the reticle micro-driving stage 11 in the X direction, Y direction and θ direction is constantly monitored by a reticle-side interferometer 14 which is disposed on the reticle supporting stand 9. Positional information S1 for the reticle micro-driving stage 11 (reticle 12) obtained by the interferometer 14 is supplied to a main control system 15.

Meanwhile, a wafer Y-axis driving stage 2, which can be freely driven in the direction of the Y-axis, is mounted on a wafer supporting stand 1, a wafer X-axis driving stage 3, which can be freely driven in the direction of the X-axis, is mounted on this wafer Y-axis driving stage 2, and a Z/θ-axis driving stage 4, which positions the wafer 5 in the Z direction and adjusts the angle of rotation, is installed on the wafer X-axis driving stage 3. A wafer 5 is held on the surface of this Z/θ-axis driving stage 4 by vacuum suction. A moving mirror 6 is also fixed to the surface of the Z/θ-axis driving stage 4, and the position of the Z/θ-axis driving stage 4 in the X direction, Y direction and θ direction is monitored by an externally installed wafer-side interferometer 7. Positional information for the Z/θ-axis driving stage 4 (wafer 5) obtained by the interferometer 7 is also supplied to the main control system 15. The main control system 15 controls the operation of the abovementioned wafer stages from the wafer Y-axis driving stage 2 through the Z/θ-axis driving stage 4 via a wafer stage controller 16, and also controls the operation of the reticle Y-axis driving stage 10 and reticle micro-driving stage 11 via a reticle stage controller 17. Furthermore, this main control system 15 systematically controls the operation of the apparatus as a whole.

Furthermore, a fiducial mark plate or the like (not shown in the figures), on which a fiducial mark as a reference for alignment of the reticle 12 and the wafer 5 is formed, is installed on the Z/θ-axis driving stage 4, and a reticle alignment microscope 18a, which is used to detect the positional deviation between the abovementioned fiducial mark and a reference mark on the reticle 12, is installed above the reticle 12. Furthermore, an off-axis type alignment sensor 18, which is used to detect the position of a wafer mark (used for alignment) on the wafer 5, is installed on one side surface (with respect to the Y axis) of the projection optical system 8. The alignment of the reticle 12 and wafer 5 is accomplished using the abovementioned fiducial mark plate and alignment sensor 18, etc.

Figure 2A:
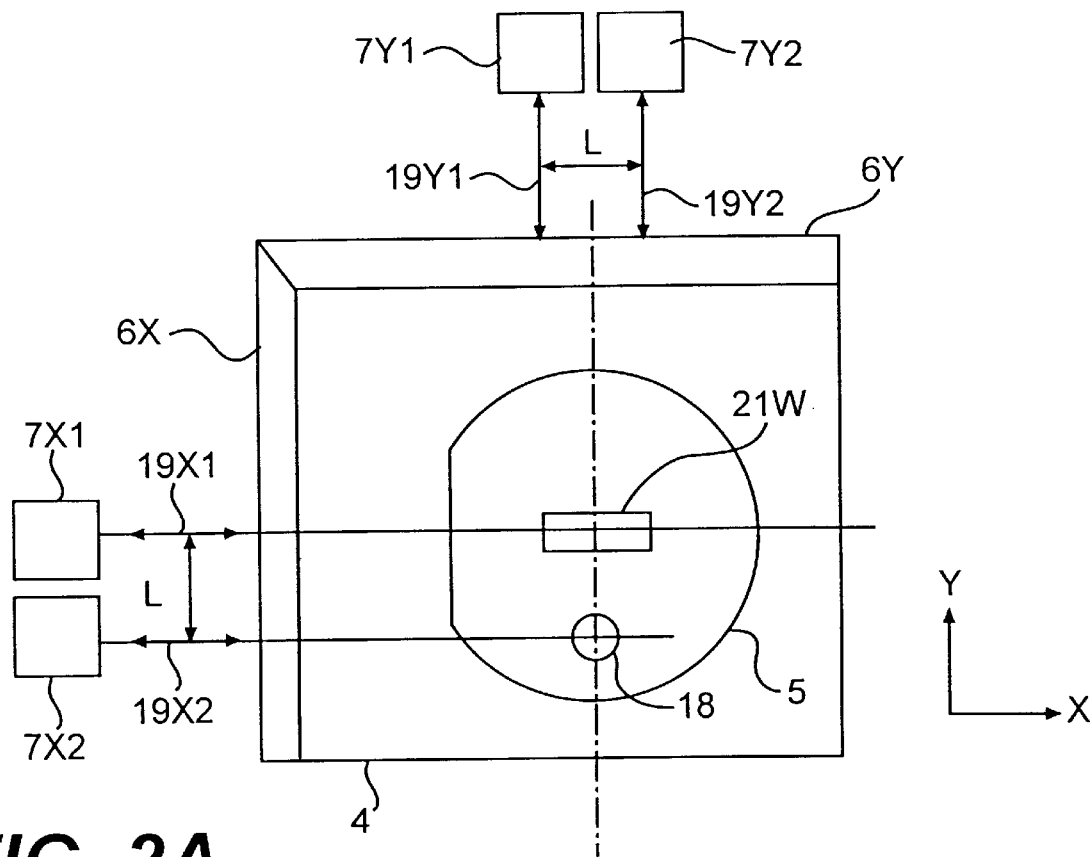
FIG. 2A is a plan view showing the construction of the wafer stage in FIG. 1.

Next, the detailed constructions of the wafer and reticle stages will be described with reference to FIGS. 2A and 2B. FIG. 2A is a plan view of the wafer stage. In FIG. 2A, a wafer 5 is placed on the surface of the Z/θ-axis driving stage 4. An X-axis moving mirror 6X and a Y-axis moving mirror 6Y are fixed to the surface of the Z/θ-axis driving stage 4, and the system is arranged so that the image of the reticle pattern is projected onto the slit-form exposure region 21W on the surface of the wafer 5 during exposure. Furthermore, the Z/θ-axis driving stage 4 is driven in the Y direction (i. e., the scanning direction) by the wafer Y-axis driving stage 2 shown in FIG. 1 using a linear motor system or the like, and is driven in the X direction by the wafer X-axis driving stage 3 using a feed screw system or the like.

The moving mirror 6X is illuminated by laser beams 19X1 and 19X2 (with spacing L) from X-axis interferometers 7X1 and 7X2 along light paths parallel to the X-axis. The light paths pass through the optical axis of the projection optical system 8 and the optical axis of the alignment sensor 18, respectively. Furthermore, the moving mirror 6Y is illuminated by laser beams 19Y1 and 19Y2 (with spacing L) from Y-axis interferometers 7Y1 and 7Y2 along light paths parallel to the Y-axis. In the present example, information with 4 degrees of freedom consisting of X-axis measurement values WX1 and WX2 obtained by the interferometers 7X1 and 7X2, and Y-axis measurement values WY1 and WY2 obtained by the interferometers 7Y1 and 7Y2, is used as positional information indicating the position of the Z/θ-axis driving stage 4.

In the present example, therefore, the rotational angle of the Z/θ-axis driving stage 4 caused by yawing can be detected in addition to the position of the Z/θ-axis driving stage 4 in the X and Y directions. Furthermore, the rotational angle can also be detected even when the interferometer 7X2 or interferometer 7Y2 is omitted, for example. However, by detecting positional information with 4 degrees of freedom and obtaining an averaged result as in the present example, it is possible to increase accuracy in detecting the position and yawing of the aforementioned stage.

Furthermore, the position in the direction of the X-axis when using the aforementioned off-axis type alignment sensor 18 is controlled on the basis of the measurement value of the interferometer 7X2 using the laser beam 19X2. As a result, so-called "Abbe errors" can be eliminated.

Figure 2B:
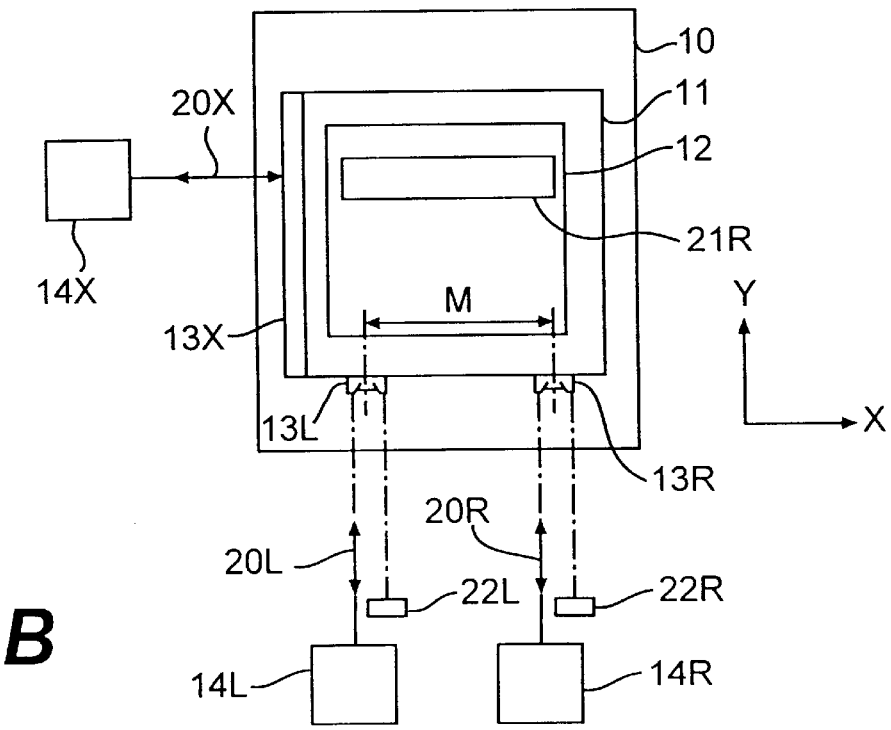
FIG. 2B is a plan view showing the construction of the reticle stage in FIG. 1.

FIG. 2B is a plan view of the reticle stage. In FIG. 2B, the aforementioned reticle micro-driving stage 11 is mounted on the reticle Y-axis driving stage 10, and a reticle 12 is held on the surface of the reticle micro-driving stage 11. Furthermore, a moving mirror 13X used for the X-axis and two corner cubes 13L and 13R used for the Y-axis are installed on the reticle micro-driving stage 11, and the moving mirror 13X is illuminated by a laser beam 20X from an interferometer 14X along a light path parallel to the X-axis. Furthermore, the corner cubes 13L and 13R are illuminated by laser beams 20L and 20R (at a spacing of M) from Y-axis interferometers 14L and 14R along respective light paths parallel to the Y-axis.

Furthermore, the laser beams 20L and 20R reflected from the corner cubes 13L and 13R return to the corner cubes 13L and 13R via respective reflecting mirrors 22L and 22R, and then return to the interferometers 14L and 14R. Thus, the interferometers 14L and 14R used for the reticle 12 are double-pass interferometers. As a result, the position detection system thus constructed can avoid positional deviations of the laser beams due to rotation of the reticle micro-driving stage 11. Furthermore, during exposure, the slit-shape illumination region 21R on the reticle 12 is illuminated at a uniform brightness by the exposing light.

The reticle Y-axis driving stage 10 in the present example is driven by respective linear motor systems in the Y direction along two driving shafts which are substantially parallel to the laser beams 20L and 20R; furthermore, the reticle micro-driving stage 11 is driven by an actuator (not shown in the figures) in the X direction with respect to the reticle Y-axis driving stage 10 along a driving shaft which is substantially parallel to the laser beam 20X. In this case, by varying the balance between the driving amounts of the two Y-axis linear motors, it is possible to rotate the reticle Y-axis driving stage 10, and therefore the reticle micro-driving stage 11, within a predetermined range. In other words, the reticle micro-driving stage 11 is driven by a driving system which has 3 degrees of freedom overall.

The measurement value RX obtained by the interferometer 14X is used as positional information indicating the position of the reticle micro-driving stage 11 in the X direction, and the measurement values RL and RR obtained by the interferometers 14L and 14R are used as positional information indicating the position of the reticle micro-driving stage 11 in the Y direction along the driving shafts of the two linear motors.

It is also possible to use a construction in that the reticle micro-driving stage 11 can be caused to perform micro-movements relative to the reticle Y-axis driving stage 10 along driving shafts that are substantially parallel to the laser beams 20L, 20R and 20X. In this case, the stage system on the side of the reticle 12 can be driven with 5 degrees of freedom overall. If the two linear motors used to drive the reticle Y-axis stage 10 in the Y direction are driven at a constant speed using open loop control and the positional deviation of the reticle 12 from the wafer 5 is corrected by controlling the aforementioned driving system with 3 degrees of freedom (used to cause micro-movements of the reticle micro-driving stage 11) using closed loop control, the control system of the present invention can be used as it is.

Next, a synchronized control method used during exposure in the projection type exposure apparatus of the present embodiment will be described with reference to FIG. 3.

FIG. 3 shows a stage control system in the present embodiment. In FIG. 3, it is assumed that the reticle 12 and wafer 5 shown in FIG. 1 have been aligned, and that the reticle 12 and wafer 5 are in their respective scanning start positions. When a control unit 15a in the main control system 15 sends a scanning exposure "start" command to a speed command generating unit 15b and a calculation unit 15c, a speed command signal indicating a target speed of the Z/θ-axis driving stage 4 (on the wafer side in FIG. 2) in the X direction (normally zero) and a target scanning speed $V_W^*$ in the Y direction is sent to a wafer stage controller 16 by the speed command generating unit 15b. The target scanning speed $V_W^*$ in the Y direction varies in a trapezoidal form with respect to time, so that said speed gradually increases from zero until a constant scanning speed $V_{W0}$ is reached, and then gradually returns to zero after a predetermined period of time. Here, the control unit 15a, speed command generating unit 15b, and calculation unit 15c are implemented as software or hardware.

In response to this, the wafer stage controller 16 drives the wafer Y-axis driving stage 2 shown in FIG. 1 in the Y direction at the target scanning speed $V_W^*$ using open loop control, and, if necessary, also drives the wafer X-axis driving stage 3 in the X direction at a predetermined target speed. In this case, the positions WX1, WX2, WY1 and WY2 of the Z/θ-axis driving stage 4 measured by the four wafer-side interferometers 7X1, 7X2, 7Y1 and 7Y2 shown in FIG. 2A are sent to the calculation unit 15c in FIG. 3 at a predetermined sampling frequency. In the calculation unit 15c, using the spacing L between the two laser beams 19X1 and 19X2 and the spacing L between the two laser beams 19Y1 and 19Y2, a vector consisting of the measurement values WX1, WX2, WY1 and WY2 is multiplied by a matrix T1 defined in the following equation, thus converting this vector into a vector consisting of the X-direction position WX, Y-direction position WY and rotational angle Wθ of the Z/θ-axis driving stage 4.

$$\begin{bmatrix} WX \\ WY \\ W\theta \end{bmatrix} = \begin{bmatrix} 1/2 & 1/2 & 0 & 0 \\ 0 & 0 & 1/2 & 1/2 \\ 1 & -1 & -1 & 1 \\ \overline{L\cdot 2} & \overline{L\cdot 2} & \overline{L\cdot 2} & \overline{L\cdot 2} \end{bmatrix} \begin{bmatrix} WX1 \\ WX2 \\ WY1 \\ WY2 \end{bmatrix} = T1 \begin{bmatrix} WX1 \\ WX2 \\ WY1 \\ WY2 \end{bmatrix} \quad (4)$$

Next, in the calculation unit 15c, matrices T3 and T2 defined in the following equation, which contain as the components the functions of the relative rotational angle θ between the reticle 12 and wafer 5 (determined by alignment using the alignment sensor 18a and 18, for example) and the magnification β (projection ratio) of the projection optical system 8 from the reticle 12 to the wafer 5, are introduced together with an offset vector B. Then, a vector (RX*, RY*, Rθ*), which contains as components the X-direction target position RX*, Y-direction target position RY* and target rotational angle Rθ* of the reticle micro-driving stage 11 of FIG. 2B, is calculated from the vector (WX, WY, Wθ) containing as the components the position and rotational angle of the Z/θ-axis driving stage 4.

$$\begin{bmatrix} RX^* \\ RY^* \\ R\theta^* \end{bmatrix} = \begin{bmatrix} \cos\theta & -\sin\theta & 0 \\ \sin\theta & \cos\theta & 0 \\ 0 & 0 & 1+\theta \end{bmatrix} \begin{bmatrix} 1/\beta & 0 & 0 \\ 0 & 1/\beta & 0 \\ 0 & 0 & 1 \end{bmatrix} \begin{bmatrix} WX \\ WY \\ W\theta \end{bmatrix} + B \quad (5)$$

$$= T3 \cdot T2 \begin{bmatrix} WX \\ WY \\ W\theta \end{bmatrix} + B$$

Here, the vector B represents offset values depending on the location of the origin in the coordinate system specifying (RX*, RY*, Rθ*), for example. As seen by comparing Eq. 1 to Eq. 5, one example of the matrix A used in Eq. 1 is the matrix T3·T2. Furthermore, using the matrix T4 which contains as the components the spacing M between the laser beams 20L and 20R shown in FIG. 2B, the calculation unit 15c converts the vector (RX*, RY*, Rθ*) into a vector (RX*, RL*, RR*) consisting of the target position of the reticle micro-driving stage 11 with respect to the three driving shafts described above (Eq. 6). In other words, the vector (RX*, RL*, RR*) is a vector which indicates the target position of the reticle micro-driving stage 11 to be measured by the interferometers 14X, 14L and 14R during scanning exposure.

$$\begin{bmatrix} RX^* \\ RL^* \\ RR^* \end{bmatrix} = \begin{bmatrix} 1 & 0 & 0 \\ 0 & 1 & M/2 \\ 0 & 1 & -M/2 \end{bmatrix} \begin{bmatrix} RX^* \\ RY^* \\ R\theta^* \end{bmatrix} = T4 \begin{bmatrix} RX^* \\ RY^* \\ R\theta^* \end{bmatrix} \quad (6)$$

In FIG. 3, the positions RX, RL and RR actually measured by the reticle-side interferometers 14 (collectively representing the interferometers 14X, 14L and 14R shown in FIG. 2B) are also sent to the calculation unit 15c. In the calculation unit 15c, an error vector (ΔRX, ΔRL, ΔRR) is determined by subtracting a vector (RX, RL, RR) indicating the actual position of the reticle micro-driving stage 11 from the vector (RX*, RL*, RR*) indicating the target position of the reticle micro-driving stage 11, as shown in the following equation. This error vector can also be expressed in terms of the aforementioned vector (WX1, WX2, WY1, WY2) which expresses the position of the Z/θ-axis driving stage 4, and matrices T1 through T4.

$$\begin{bmatrix} \Delta RX \\ \Delta RL \\ \Delta RR \end{bmatrix} = \begin{bmatrix} RX^* \\ RL^* \\ RR^* \end{bmatrix} - \begin{bmatrix} RX \\ RL \\ RR \end{bmatrix} \quad (7)$$

$$= T4 \cdot T3 \cdot T2 \cdot T1 \begin{bmatrix} WX1 \\ WX2 \\ WY1 \\ WY2 \end{bmatrix} + B' - \begin{bmatrix} RX \\ RL \\ RR \end{bmatrix}$$

In the present embodiment, a composite error vector (ΔRX', ΔRL', ΔRR') is determined by adding a correction vector C as a correction term to the error vector (ΔRX, ΔRL, ΔRR), as defined in the following equation, and the exposure operation is controlled in such a way as to eliminate the composite error vector (ΔRX', ΔRL', ΔRR') to perform highly accurate alignment.

$$\begin{bmatrix} \Delta RX' \\ \Delta RL' \\ \Delta RR' \end{bmatrix} = \begin{bmatrix} \Delta RX \\ \Delta RL \\ \Delta RR \end{bmatrix} + C \quad (8)$$

-continued $$= \begin{bmatrix} \Delta RX \\ \Delta RL \\ \Delta RR \end{bmatrix} + \begin{bmatrix} d1 \\ d2 \\ d3 \end{bmatrix} V_{wo} + f \begin{bmatrix} RX \\ RL \\ RY \end{bmatrix} + w \begin{bmatrix} WX1 \\ WX2 \\ WY1 \\ WY2 \end{bmatrix} + \begin{cases} \alpha 1 \ (V_{wo} > 0) \\ \alpha 2 \ (V_{wo} < 0) \end{cases}$$

The vector (d1, d2, d3) in Eq. 8 is a speed-proportional coefficient vector, and the vector (d1, d2, d3)$V_{W0}$ is a speed-proportional correction term which is proportional to the scanning speed $V_{W0}$ of the wafer 5. Furthermore, f is a coefficient matrix corresponding to a correction term that depends on the vector (RX, RL, RR) (the reticle-side stage position) and w is a coefficient matrix corresponding to a correction term that depends on the vector (WX1, WX2, WY1, WY2) (the wafer-side stage position). The symbols α1 and α2 are offset vectors corresponding to correction terms that depend on the scanning direction of the wafer 5. Among these correction terms, the speed-proportional coefficient vector (d1, d2, d3) and the offset vectors α1 and α2 are correction vectors which are peculiar to each projection type exposure apparatus. Below, these correction terms will be described with reference to FIGS. 4A through 7B.

FIGS. 4A and 4B show the positional deviations of the transferred pattern image from its ideal position in one shot area on the surface of the wafer 5 caused by differences in the scanning speed $V_{W0}$ of the wafer-side Z/θ-axis driving stage 4 (i. e., the wafer 5) during scanning exposure. FIG. 4A shows a case in which the scanning speed $V_{W0}$ is set at a high speed $V_H$, and FIG. 4B shows a case in which the scanning speed $V_{W0}$ is set at a low speed $V_L$. The positional deviations in FIGS. 4A and 4B show the conditions of positional deviations in a case where the correction vector C in Eq. 8 is set to (0, 0, 0). Here, in the case of FIG. 4B, the transferred pattern image $SA_L$, which is produced by scan-exposing the wafer at the low scanning speed $V_L$ with respect to the slit-shape exposure region 21W, coincides with the shot area SA (the ideal pattern) to a substantial degree. However, in the case of FIG. 4A, the transferred pattern image $SA_H$, which is produced by scan-exposing the wafer at a high scanning speed $V_H$, shows a considerable positional deviation in the scanning direction with respect to the shot area SA (the ideal pattern). In this example, therefore, a positional deviation in the transferred pattern image, which is substantially proportional to the scanning speed $V_{W0}$ of the wafer, is generated. This positional deviation may be caused by delay in the response speed of the control system, etc.

In an actual exposure process, there may be unavoidable changes in the speed of synchronized scanning in a projection type exposure apparatus. The reason for this is as follows. For example, when a photoresist with ordinary sensitivity is replaced by a highly sensitive photoresist, the amount of exposure energy required for exposure changes. Accordingly, if the width of the exposure region 21W is constant, it naturally becomes necessary to change the scanning speed $V_{W0}$ of the wafer. As a result, the correction term (d1, d2, d3)$V_{W0}$ using a speed-proportional coefficient vector (d1, d2, d3), which is proportional to the scanning speed $W_{W0}$ of the wafer 5, becomes necessary as described above.

One example of a method which can be used to calculate the speed-proportional coefficient vector (d2, d2, d3) is as follows. The positional deviation between the shot area SA and the actual transfer pattern image is measured at two points: e.g., at a lower scanning speed $V_L$ and at a higher scanning speed $V_H$ that is close to the mechanical maximum speed, and the resulting amounts of positional deviation are divided by the scanning speed, thus determining a mean value for the coefficient.

Figure 5A:
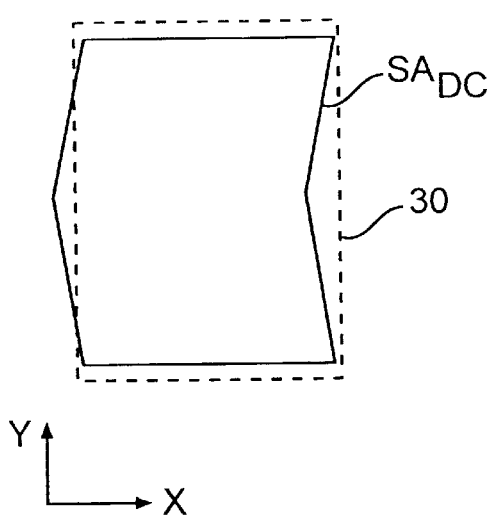
FIGS. 5A, 5B, 5C, 5D, and 5E illustrate various types of distortions of the transferred pattern image on the wafer, which depend on the reticle coordinates.
Figure 5B:
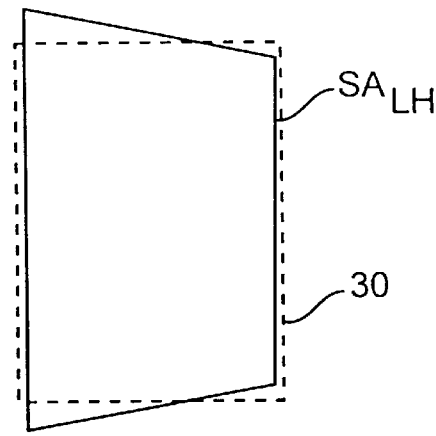
Figure 5C:
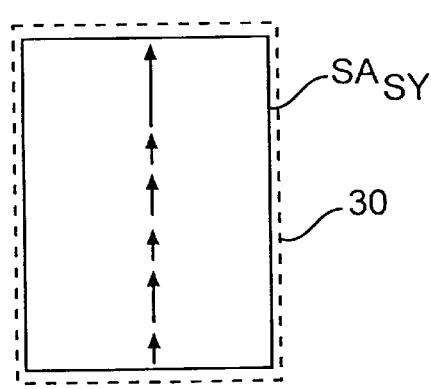

FIGS. 5A to 5E show positional deviations (distortion) of the transferred pattern image generated by the correction term depending on the reticle-side position vector (RX, RL, RR) in the correction vector C. FIG. 5A shows a transferred pattern image $SA_{DI}$ in which a positional deviation in the −X direction has been generated at an intermediate point along the Y direction with respect to the undistorted transfer pattern image 30 (or ideal pattern). FIG. 5B shows a transferred pattern image $SA_{LH}$ in which a positional deviation has occurred so that the transfer pattern length on the +X side is substantially equal to that of the transfer pattern image 30, while the transfer pattern length on the −X side is longer than that of the transfer pattern image 30. Furthermore, FIG. 5C shows a transfer pattern image $SA_{SY}$ in which a synchronization shift has occurred in the Y direction with respect to the undistorted transfer pattern image 30. The reason why such controlled distortions of the transfer pattern images $SA_{DI}$, $SA_{LH}$ and $SA_{SY}$ are necessary is that the existing circuit pattern or the like in the shot area, which has been formed in the previous step, may have distortion in the shape of the image due to alignment errors or the like. For example, such distortion in the previous pattern on the wafer may be due to the characteristics of a particular exposure apparatus that has exposed that pattern. This correction term is therefore used to distort the next pattern image to align the image with the distorted existing pattern on the wafer with high accuracy.

In this case, it is desirable to determine the coefficient matrix f in Eq. 8 in accordance with the distortion of the existing pattern in advance to adjust the composite error vector for the next exposure operation. In this case, the coefficient matrix f thus obtained may be stored in a memory 15d (FIG. 3). More generally, the memory 15d may store data indicating the distortion of the existing pattern itself to adjust the target position of the reticle stage.

An example of the coefficient matrix f suitable for the situation shown in FIG. 5A is a matrix in which only the elements $f_{21}$ and $f_{31}$ are not zero, as shown below.

$$f = \begin{bmatrix} 0 & f_{21} & f_{31} \\ 0 & 0 & 0 \\ 0 & 0 & 0 \end{bmatrix} \quad (9)$$

Figure 5D:
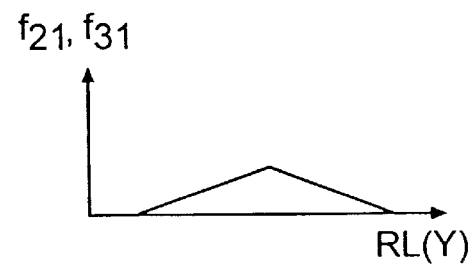

In this case, the elements $f_{21}$ and $f_{31}$ are functions which vary in the form of a peak according to one of the Y coordinates RL of the reticle 12 as shown in FIG. 5D. As a result, the X coordinate RX of the reticle 12 is gradually displaced by an amount equal to $f_{21}(RL+RR)$, so that a transfer pattern image $SA_{DI}$ of the type shown in FIG. 5A is obtained.

The coefficient matrix f in Eq. 9 may be also useful when exposure is performed while the reticle 12 is laterally shifted in the X direction as a result of mechanical deformation of the projection type exposure apparatus or the like.

Furthermore, the coefficient matrix f shown in Eq. 10 below may be used to obtain the transferred pattern image $SA_{LH}$, which is distorted into a trapezoidal shape as shown in FIG. 5B. In Eq. 10, the elements $f_{22}$ and $f_{32}$ are constants. Therefore, a correction of $(f_{22} \cdot RL + f_{32} \cdot RR)$ is applied to only one of the Y coordinates of the reticle 12, i. e., RL, so that a trapezoidal distortion is obtained.

$$f = \begin{bmatrix} 0 & 0 & 0 \\ 0 & f_{22} & f_{32} \\ 0 & 0 & 0 \end{bmatrix} \quad (10)$$

Furthermore, the following coefficient matrix f may be used in order to cause a positional deviation in the Y direction as shown in FIG. 5C:

$$f = \begin{bmatrix} 0 & 0 & 0 \\ 0 & f_{22} & f_{32} \\ 0 & f_{23} & f_{33} \end{bmatrix} \quad (11)$$

Figure 5E:
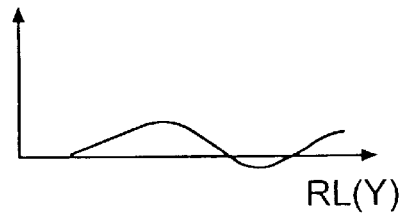

In the transformation matrix in Eq. 11, all of the elements except for the elements $f_{22}$, $f_{32}$, $f_{23}$ and $f_{33}$ are zero, and the elements $f_{22}$ through $f_{33}$ are functions of the Y coordinates RL and RR, as shown in FIG. 5E. As a result, a correction is applied to the two Y coordinates RL and RR of the reticle 12, so that a transfer pattern image $SA_{SY}$ of the type shown in FIG. 5C is obtained.

Next, FIG. 6 is a schematic view of the wafer having the distribution of distortions in the existing pattern on the wafer. In this case, the distortion of the pattern depends on the position in the wafer, i.e., the position vector (WX1, WX2, WY1, WY2) of the wafer. In the respective shot areas of the wafer 5 shown in FIG. 6, partial distortion has occurred as a result of warp or deformation of the wafer 5 due to heat treatment or the like. In FIG. 6, regular circuit patterns are formed in the shot areas 101 through 113 on the right half of the wafer 5. On the other hand, distortion of the circuit pattern gradually increases from the shot areas 114 through 118 to the shot areas 119 through 123, and then to the shot areas 124 through 126. In the manufacture of semiconductor devices, or the like, even if extreme care is taken, deformation of the wafer 5, such as warping, undulations and distortion, etc., cannot be completely eliminated. It is therefore necessary to solve this problem in the exposure step of patterns using the projection type exposure apparatus.

Accordingly, a correction term which distort the transfer pattern image according to the coordinate vector (WX1, WX2, WY1, WY2) of the wafer-side stage are provided in the correction vector C in Eq. 8. The coefficient matrix w of these correction terms is determined in accordance with the distortion of the wafer 5 (or distribution of the distortions over a plurality of shot areas). The coefficient matrix f may be stored in a memory 15d (FIG. 3). More generally, the memory 15d may store data indicating the distribution of distortions in the existing pattern to adjust the target position of the reticle stage.

One example of a coefficient matrix w for a wafer 5 deformed as shown in FIG. 6 is the following matrix.

$$w = \begin{bmatrix} 0 & 0 & 0 & 0 \\ w_{12} & w_{22} & 0 & 0 \\ 0 & 0 & 0 & 0 \end{bmatrix} \quad (12)$$

In the coefficient matrix w shown in Eq. 12, all of the elements except for the elements $w_{12}$ and $w_{22}$ are zero, and the elements $w_{12}$ and $w_{22}$ are functions of the coordinates WX1, WX2, WY1 and WY2 corresponding to the position of the wafer 5. If this coefficient matrix w is used, one of the Y coordinates RL of the reticle 12 is corrected, so that the transfer pattern image is distorted to match the respective shot areas in FIG. 6, thus reducing the superimposition error.

One example of the calculation method of the coefficient matrix w according to such distribution of image distortions on the wafer 5 will be described below. Suppose that an exposure process used in the manufacture of a certain semiconductor element is performed 10 times. In this case, in the course of the 10-time repetition of the exposure process, the number of thin films laminated on one side of the wafer 5, and the heat treatment history of the wafer 5 change. Accordingly, the image distortions and the distribution thereof over the plurality of shot areas caused by these factors also change in the course of the 10-time repetition of the exposure process. The coefficient matrix w to be used for aligning the new pattern with the distorted existing pattern is determined by detecting the distortions on several wafers, and by taking an average prior to each exposure step. This way, the coefficient matrix w corresponding to the deformation of the wafer 5 in the 7th exposure operation, for example, can be obtained in advance of exposing the next 8th exposure operation, so that the transfer pattern image can be accurately distorted to match the new pattern with the existing pattern on the wafer for the respective shot areas. Alternatively, by taking an average over exposure results from several exposure steps (5th, 6th, and 7th exposure operations, for example), the averaged coefficient matrix W may be obtained in advance of the next exposure (8th exposure, for example).

FIGS. 7A and 7B show the positional deviations of the transfer pattern image generated by the offset vectors α1 and α2 for the scanning direction of the wafer 5 in the correction vector C shown in Eq. 8. FIG. 7A shows the positional deviation of the transferred pattern image $SA_F$ from the ideal pattern SA in a shot area when the wafer 5 is scanned in the +Y direction with respect to the exposure region 21W. FIG. 7B shows the positional deviation of the transferred pattern image $SA_R$ from the ideal pattern SA in a shot area when the wafer 5 is scanned in the −Y direction. The amount of the positional deviation varies slightly according to the scanning direction.

This is considered to be due to the face that mechanical deformation of the stages, the mechanical characteristics of the stages, and the electrical characteristics of the stages are not completely identical in the positive and negative scanning directions. This becomes a problem particularly when the permissible range of superimposition errors (or alignment errors) is small. Accordingly, an offset vector α1 (=(α1$_{RX}$, α1$_{RL}$, α1$_{RR}$)) for scanning exposure in the positive direction (+Y direction) and an offset vector α2 for scanning exposure in the negative direction are necessary. These offset vectors are determined beforehand by test exposure or the like and represented by Eq. 13 below. Correction based on the offset vectors is performed during scanning exposure.

$$\alpha 1 = \begin{bmatrix} \alpha 1_{RX} \\ \alpha 1_{RL} \\ \alpha 1_{RR} \end{bmatrix} \quad (13)$$

$$\alpha 2 = \begin{bmatrix} \alpha 2_{RX} \\ \alpha 2_{RL} \\ \alpha 2_{RR} \end{bmatrix}$$

Finally, the composite error vector (ΔRX', ΔRL', ΔRR') is obtained by adding the correction vector C thus obtained in a above-mentioned manner to the error vector (ΔRX, ΔRL, ΔRR) in the calculation unit 15c. The calculation unit 15c sends the result to the reticle stage controller 17. In the reticle stage controller 17, the reticle Y-axis driving stage 10 and the driving system of the reticle micro-driving stage 11 (with three degrees of freedom) shown in FIG. 2B are controlled so that the composite error vector thus supplied is maintained at (0, 0, 0). Furthermore, the results of this control operation are fed back to the calculation unit 15c as the measurement values of the three interferometers 14X, 14L and 14R, so that the reticle micro-driving stage 11 is driven using closed-loop control. As a result, the reticle micro-driving stage 11 (i. e., the reticle 12) is driven in the −Y direction at a speed of $(1/\beta)V_{W0}$ while maintaining a predetermined relative rotational angle of θ in synchronization with the driving of the Z/θ-axis driving stage 4 (i. e., the wafer 5) in the +Y direction at a constant speed of $V_{W0}$, for example.

In the present embodiment, as described above, a vector (RX*, RL*, RR*) which indicates the target position and target rotational angle of the reticle micro-driving stage 11 is calculated by multiplying a vector (WX1, WX2, WY1, WY2) containing positional coordinates (with four degrees of freedom) for the wafer 5-side Z/θ-axis driving stage 4 as components by a matrix (T4·T3·T2·T1) and adding an offset vector B, as shown in Eqs. 7 and 8. Furthermore, a composite error vector (ΔRX', ΔRL', ΔRR') is calculated by subtracting a vector (RX, RL, RR) indicating the actual position from the abovementioned vector, and adding a correction vector C, and positioning is performed on the basis of this composite error vector.

Accordingly, even if yawing of the wafer Y-axis driving stage 2 occurs during scanning exposure so that the Z/θ-axis driving stage 4 rotates, the target position and target rotational angle of the reticle micro-driving stage 11 can be updated on a real-time basis so that the position and rotational angle of the reticle micro-driving stage 11 are constantly corrected. As a result, synchronized scanning can be performed with the reticle 12 aligned with the wafer 5 at a high correction speed with high accuracy. At the same time, distortion of the transfer pattern image is controlled by adjusting a correction vector C in accordance with the scanning speed $V_{W0}$ of the wafer 5, the scanning direction, the position of the reticle 12, and the position of the wafer 5. Accordingly, the superimposition error can be reduced to an extremely small value.

Furthermore, in the embodiment described above, the wafer stage controller 16 is controlled as a speed reference as shown in FIG. 3. However, it is also possible to control the wafer stage controller 16 using a positional reference. That is, it is possible to design the system such that information concerning a target position that constantly changes over time with a predetermined period is sent to the wafer stage controller 16, and the wafer stage controller 16 controls the position of the wafer Y-axis driving stage 2, etc., in accordance with this information.

Furthermore, in the construction shown in FIG. 1, the reticle 12 is mounted on the reticle Y-axis driving stage 10 via a reticle micro-driving stage 11. However, it is also possible to omit the reticle micro-driving stage 11, and install between the wafer Y-axis driving stage 2 and the wafer 5 a micro-motion stage for changing the position of the wafer 5 within a predetermined range in the Y direction in two locations separated by predetermined spacing in the X direction. In this case, the system may be designed such that the reticle Y-axis driving stage 10 is controlled using open-loop control, and the wafer Y-axis driving stage 2 (on the side of the wafer 5) and the micro-motion stage, etc., (wafer stage) are controlled using closed-loop control in accordance with a target position of the wafer stage calculated from the measured position of the reticle Y-axis driving stage 10.

Furthermore, in the embodiment described above, the stage position on the side of the wafer 5 is measured with four degrees of freedom, and the stage position on the side of the reticle 12 was measured with three degrees of freedom, as shown in FIG. 2. However, it is also possible to measure the positions of both the wafer-side stage and the reticle-side stage with three degrees of freedom. Alternatively, it is possible to measure the position of the wafer-side stage with three degrees of freedom and the position of the reticle-side stage with four degrees of freedom, or to measure the positions of both the wafer-side and reticle-side stages with four or more degrees of freedom. As the number of degrees of freedom of measurement is increased in this way, the measurement precision of the position and rotational angle based on averaged results is improved.

The simplified equations are presented above as an example to facilitate understanding of the present invention. It will be apparent to those skilled in the art that various modifications and variations are possible on these equations to accommodate differences in types of exposure apparatus, etc. For example, a general multiple-value function (vector function), which depends on the velocity, the coordinate positions, etc., may be used instead of the matrix-form equations above.

In the scan type exposure apparatus of the present invention, the position of one of two stages (mask stage or substrate stage) is controlled in accordance with an error vector quantity and a correction vector quantity. The error vector quantity is obtained by subtracting a vector quantity containing the measurement results of one of two position measuring devices from a vector quantity obtained by multiplying a vector quantity containing as components the measurement results of the other one of the two position measuring devices by a transformation matrix consisting of components which include the magnification between the aforementioned mask and substrate and the rotational angle between said mask and substrate. The correction vector quantity corresponds to the amount of deviation in the transfer position of a preset mask pattern. Accordingly, even when one of the aforementioned two stages rotates, the mask and substrate can be aligned at a high correction speed with high accuracy, and furthermore the superimposition error can be reduced by distorting the transfer pattern image by a predetermined amount.

Furthermore, when the aforementioned correction vector quantity contains at least one component selected from a group consisting of a component which is proportional to the scanning speed of one of the aforementioned two stages, a component which varies according to the position of the aforementioned mask stage, a component which varies according to the position of the aforementioned substrate stage, and an offset component which varies according to the scanning direction of one of the aforementioned two stages, the superimposition error can be further reduced by deforming the pattern image to be transferred in accordance with mechanical deformation of the respective stage mechanisms, distortion of the exposure apparatus which has exposed the preceding layers, thermal deformation of the substrate (wafer, etc.), and control error of the stage mechanisms, etc.

It will be apparent to those skilled in the art that various modifications and variations can be made in the scanning exposure apparatus and method of the present invention without departing from the spirit or scope of the invention. Thus, it is intended that the present invention cover the modifications and variations of this invention provided they come within the scope of the appended claims and their equivalents.

What is claimed is:

1. A scanning exposure apparatus for synchronously moving a mask and a substrate with respect to an exposing radiation flux to project an image of a mask pattern on the mask onto the substrate, the scanning exposure apparatus comprising:
 a movable mask stage for holding the mask;
 a movable substrate stage for holding the substrate;
 a projection optical system projecting the image of the mask pattern onto the substrate with a predetermined projection ratio;
 a mask position detector outputting first signals indicating the position of the mask stage;
 a substrate position detector outputting second signals indicating the position of the substrate stage;
 a calculation unit processing the first signals and the second signals in accordance with the projection ratio of the projection optical system and an initial rotational angle of the mask relative to the substrate to derive a positional deviation of the mask stage relative to the substrate stage; and
 a controller controlling the mask stage movement and the substrate stage movement to eliminate the positional deviation, the controller adjusting only one of the mask stage movement and the substrate stage movement in order to offset the positional deviation of the mask stage relative to the substrate stage.

2. The scanning exposure apparatus according to claim 1, wherein the calculation unit processes the second signals in accordance with the projection factor and the initial rotational angle to derive a target position of the mask stage, the calculation unit processing the first signals to derive a positional deviation of the mask stage from the target position, and
 wherein the controller controls the mask stage movement such that the mask stage approaches the target position.

3. The scanning exposure apparatus according to claim 2, further comprising a memory for storing data indicating the distortion of an existing pattern on the substrate, wherein the calculation unit processes the data to adjust the target position.

4. The scanning exposure apparatus according to claim 2, further comprising a memory for storing data indicating the distortion of the mask pattern on the mask, wherein the calculation unit processes the data to adjust the target position.

5. The scanning exposure apparatus according to claim 2, where in the mask pattern is projected onto each of a plurality of shot areas on the substrate, the apparatus further comprising a memory for storing data indicating the distortion of an existing pattern in each of the shot areas as compared to a design pattern thereof and the distribution of the distortions over the plurality of shot areas, wherein the calculation unit processes the data to adjust the target position.

6. The scanning exposure apparatus according to claim 2, wherein the calculation unit processes the second signals to derive the velocity of the substrate stage to adjust the target position.

7. The scanning exposure apparatus according to claim 2, wherein the calculation unit processes the second signals to derive the direction of the substrate stage movement to adjust the target position.

8. The scanning exposure apparatus according to claim 1, wherein the calculation unit processes the first signals in accordance with the projection ratio and the initial rotational angle to derive a target position of the substrate stage, the calculation unit processing the second signals to determine a positional deviation of the substrate stage from the target position, and
 wherein the controller controls the substrate stage movement such that the substrate stage approaches the target position.

9. The scanning exposure apparatus according to claim 1, wherein the mask position detector detects the position of the mask stage in terms of a translational displacement and a rotational angle, and the substrate position detector detects the position of the substrate stage in terms of a translational displacement and a rotational angle, and
 wherein the calculation unit processes the first signals and the second signals in accordance with the projection ratio of the projection optical system and the initial rotational angle to derive the positional deviation of the mask stage relative to the substrate stage in terms of a translational displacement and a rotational angle.

10. A scanning exposure apparatus for projecting a mask pattern on a mask onto a substrate, comprising:
 a movable mask stage for holding the mask;
 a movable substrate stage for holding the substrate, the substrate stage moving in synchronization with the mask stage movement;
 an illumination system directing an exposing radiation flux toward the mask to illuminate a portion of the mask pattern;
 a projection optical system receiving the exposing radiation that has passed through the mask to project the image of the mask pattern onto the substrate with a predetermined projection ratio;
 a mask position detector outputting first signals indicating the position of the mask stage in a first two-dimensional plane as a first vector quantity;
 a substrate position detector outputting second signals indicating the position of the substrate stage in a second two-dimensional plane as a second vector quantity;
 a calculation unit applying a transfer matrix in accordance with the projection ratio of the projection optical system and the rotational angle of the mask relative to the substrate, the calculation unit processing the first signals and the second signals to subtract one of the first and second vector signals from a vector obtained by multiplying the transfer matrix by the other one of the first and second vector signals to derive an error vector representing a relative positional deviation between the mask and the substrate, the calculation unit further processing data indicating patterning errors in the existing pattern on the substrate to derive a calibration vector; and
 a controller controlling the position of the mask stage relative to the substrate stage in accordance with the error vector and the calibration vector, the controller adjusting only one of the mask stage movement and the substrate stage movement in order to offset the error vector representing the relative positional deviation between the mask and the substrate.

11. The scanning exposure apparatus according to claim 10, wherein the calculation unit derives the calibration vector from data indicating at least one of the velocity of the mask stage, the velocity of the substrate stage, the direction of the mask stage movement, the direction of the substrate stage movement, the position of the mask stage, and the position of the substrate stage.

12. A method of aligning a mask with a substrate during scanning exposure operation of an scanning exposure apparatus, the method comprising the steps of:

moving in a first predetermined direction a mask stage holding the mask;

moving in a second predetermined direction in synchronization with the mask stage movement a substrate stage holding the substrate;

during the step of moving the substrate stage, directing an exposing radiation flux toward the mask to illuminate a portion of a mask pattern on the mask, the exposing radiation flux thereafter entering a projection optical system to project the mask pattern onto the substrate with a predetermined projection ratio;

outputting first signals indicating the position of the mask stage during the step of moving the substrate stage;

outputting second signals indicating the position of the substrate stage during the step of moving the substrate stage;

processing the first signals and the second signals in accordance with the projection ratio of the projection optical system to derive a relative positional deviation between the mask stage and the substrate stage during the step of moving the substrate stage; and during the step of moving the substrate stage, controlling the mask stage movement and the substrate stage movement to eliminate the relative positional deviation derived in the step of processing, wherein only one of the mask stage movement and the substrate stage movement is adjusted in order to offset the relative positional deviation.

13. The method according to claim 12, wherein the step of processing includes the steps of processing the second signals in accordance with the projection factor to derive a target position of the mask stage; and processing the first signals to determine a positional deviation of the mask stage from the target position, and wherein the step of controlling includes the step of controlling the mask stage movement such that the mask stage approaches the target position.

14. The method according to claim 12, further comprising the step of determining a rotational angle of the mask on the mask stage relative to the substrate on the substrate stage, wherein the step of processing includes the steps of processing the second signals in accordance with the projection factor and the determined rotational angle to derive a target position of the mask stage; and processing the first signals to determine a positional deviation of the mask stage from the target position, and wherein the controller controls the mask stage movement such that the mask stage approaches the target position.

15. The method according to claim 14, further comprising the step of storing data indicating the distortion of the existing pattern on the substrate, wherein the step of processing includes the step of processing the data to adjust the target position.

16. The method according to claim 14, further comprising the step of storing data indicating the distortion of the mask pattern on the mask, wherein the step of processing includes the step of processing the data to adjust the target position.

17. The method according to claim 14, wherein the step of directing includes the step of projecting the mask pattern on each of a plurality of shot areas formed on the substrate, the method further comprising the step of storing data indicating the distortion of the existing pattern for each of the shot areas as compared to the design pattern thereof and the distribution of the distortions over the plurality of shot areas, wherein the step of processing includes the step of processing the data to adjust the target position.

18. The method according to claim 14, wherein the step of processing includes the step of processing the second signals to determine the velocity of the substrate stage to adjust the target position.

19. The method according to claim 14, wherein the step of processing includes processing the second signals to determine the direction of the substrate stage movement to adjust the target position.

20. The method according to claim 12, wherein the step of processing includes the steps of processing the first signals in accordance with the projection factor to derive a target position of the substrate stage; and processing the second signals to determine a positional deviation of the substrate stage from the target position, and wherein the step of controlling includes controlling the substrate stage movement such that the substrate stage approaches the target position.

21. The method according to claim 12, further comprising the step of determining a rotational angle of the mask on the mask stage relative to the substrate on the substrate stage, wherein the step of processing includes the steps of processing the first signals in accordance with the projection factor and the determined rotational angle to derive a target position of the substrate stage; and processing the first signals to determine a positional deviation of the substrate stage from the target position, and wherein the step of controlling includes controlling the substrate stage movement such that the substrate stage approaches the target position.

22. A scanning exposure apparatus for projecting a mask pattern on a mask onto a substrate, comprising:

a movable mask stage for holding the mask;

a movable substrate stage for holding the substrate, the substrate stage moving in synchronization with the mask stage movement;

an illumination system directing an exposing radiation that has passed through the mask to project the image of the mask pattern onto the substrate;

a mask position detector outputting first signals indicating the position of the mask stage in a first two-dimensional plane;

a substrate position detector outputting second signals indicating the position of the substrate stage in a second two-dimensional plane;

a calculation unit applying a transfer matrix in accordance with the rotational angle of the mask relative to the substrate, the first signals, and the second signals to derive an error vector representing a relative positional deviation between the mask stage and the substrate stage; and a controller that controls the mask movement and the substrate movement based on said error vector, wherein only one of the mask movement and the substrate movement is adjusted in order to offset the error vector.

23. A scanning exposure method for exposing an image of a mask pattern on the substrate during synchronously moving a mask and a substrate, the method comprising the steps of:

applying a transfer matrix in accordance with the rotational angle of the mask relative to the substrate, the position of the mask in a first two-dimensional plane, and the position of the substrate in a second two-dimensional plane to derive an error vector representing a relative positional deviation between the mask and the substrate; and controlling the mask movement and the substrate movement based on said error vector, wherein only one of the mask movement and the substrate movement is adjusted in order to offset the error vector.

24. A scanning exposure apparatus for synchronously moving a mask and a substrate with respect to an exposing radiation flux to transfer an image of a mask pattern onto a substrate by scanning operation, the scanning exposure apparatus comprising:

a movable mask stage for holding the mask;

a movable substrate stage for holding the substrate; and a control unit coupled to the mask stage and the substrate stage, the control unit controlling a relative position between the mask stage and the substrate stage during synchronous movements of the mask and the substrate in accordance with first vector information to shape the image of the mask pattern that is being transferred onto the substrate as a result of the scanning operation to be consistent with an existing circuit pattern on the substrate.

25. The scanning exposure apparatus according to claim 24, wherein the control unit controls the relative position between the mask stage and the substrate stage in accordance with the first vector information and second vector information indicating synchronization errors during the synchronous movements of the mask and the substrate.

26. The scanning exposure apparatus according to claim 24, wherein the first vector information represents information as a function of the position of the mask stage.

27. The scanning exposure apparatus according to claim 24, wherein the first vector information includes information indicating distortion of the existing circuit pattern on the substrate.

28. The scanning exposure apparatus according to claim 24, wherein the first vector information includes information indicating characteristics of an exposure apparatus that has exposed the existing circuit pattern on the substrate.

29. The scanning exposure apparatus according to claim 24, wherein the first vector information represents information as a function of the position of the substrate stage.

30. The scanning exposure apparatus according to claim 24, wherein the first vector information includes information indicating distortion of the substrate.

31. The scanning exposure apparatus according to claim 24, wherein the first vector information includes information indicating a previous exposure process.

32. The scanning exposure apparatus according to claim 24, wherein at least one of the mask stage and the substrate stage moves and rotates in a two-dimensional plane, and the first vector information includes a correction vector to correct the two-dimensional position and the rotation angle of the at least one of the mask stage and the substrate stage.

33. The scanning exposure apparatus according to claim 32, further comprising a substrate position detector interacting with the substrate stage to detect a position of the substrate stage, wherein the control unit controls the two-dimensional position and the rotation angle of the mask stage according to the position of the substrate stage detected by the substrate position detector.

34. The scanning exposure apparatus according to claim 24 wherein the first vector information is derived from positional information of one of the mask stage and the substrate stage multiplied by a matrix.

35. A method for transferring an image of a mask pattern on a mask onto a substrate, the mask being held in a movable mask stage and the substrate being held in a movable substrate stage, the method comprising the steps of:

synchronously moving the mask stage and the substrate stage with respect to an exposing radiation flux to transfer the mask pattern on the mask onto the substrate by scanning operation; and during the step of synchronously moving, controlling a relative position between the mask stage and the substrate stage in accordance with first vector information to shape the image of the mask pattern that is being transferred onto the substrate as a result of the scanning operation to be consistent with an existing circuit pattern on the substrate.

36. The method according to claim 35 wherein the step of controlling includes controlling the relative position between the mask stage and the substrate stage in accordance with the first vector information and second vector information representing synchronization errors during the step of synchronously moving.

37. The method according to claim 35, wherein the first vector information represents information as a function of the position of the mask stage.

38. The method according to claim 35, wherein the first vector information includes information indicating distortion of the existing circuit pattern on the substrate.

39. The method according to claim 35, wherein the first vector information includes information indicating characteristics of an exposure apparatus that has exposed the existing circuit pattern on the substrate.

40. The method according to claim 35, wherein the first vector information represents information as a function of the position of the substrate stage.

41. The method according to claim 35, wherein the first vector information includes information indicating distortion of the substrate.

42. The method according to claim 35, wherein the first vector information includes information indicating a previous exposure process.

43. The method according to claim 35, wherein the step of synchronously moving includes translationally and rotationally moving at least one of the mask stage and the substrate stage in a two-dimensional plane, the first vector information including a correction vector for correcting the two-dimensional position and the rotation angle of the at least one of the mask stage and the substrate stage.

44. The method according to claim 43, wherein the step of controlling includes controlling the two-dimensional position and the rotation angle of the mask stage according to positional information of the substrate stage.

45. A scanning exposure method according to claim 35 wherein the step of controlling includes deriving the first vector information from positional information of one of the mask stage and the substrate stage multiplied by a matrix.

46. A method for manufacturing a scanning exposure apparatus for synchronously moving a mask and a substrate with respect to an exposing radiation flux to transfer a pattern on a mask onto a substrate by scanning operation, the method comprising:

providing a movable mask stage for holding the mask;

providing a movable substrate stage for holding the substrate; and providing a control unit coupled to the mask stage and the substrate stage, the control unit controlling a relative position between the mask stage and the substrate stage during synchronous movements of the mask stage and the substrate stage in accordance with first vector information to shape the image of the mask pattern that is being transferred onto the substrate as a result of the scanning operation to be consistent with an existing circuit pattern on the substrate.

* * * * *